Aug. 24, 1965 B. NORTON ETAL 3,202,820

INFRARED DETECTOR MOUNTING STRUCTURE

Filed Jan. 28, 1963

INVENTORS
BRUCE NORTON
RUSSELL D. DEWAARD

BY Joseph Levinson

ATTORNEY 3,202,820
Patented Aug. 24, 1965

3,202,820

INFRARED DETECTOR MOUNTING STRUCTURE

Bruce Norton, Westport, and Russell D. De Waard, Old Greenwich, Conn., assignors to Barnes Engineering Company, Stamford, Conn., a corporation of Delaware
Filed Jan. 28, 1963, Ser. No. 254,390
5 Claims. (Cl. 250—83)

Figure 1:
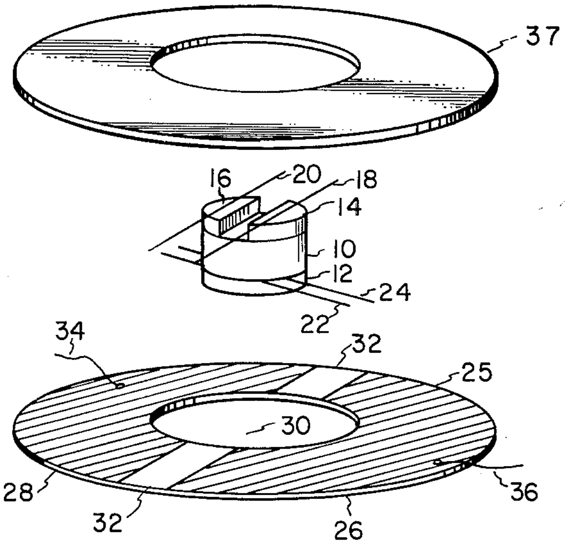

This invention relates to a mounting structure for providing electrical connections to an unbacked thermal detector which effectively thermally isolates the detector from its mounting and environment and a method of making the same.

In radiometers responding to chopped radiation, a detector having a fast response is desirable. The detector must heat up rapidly in response to incident radiation and must be capable of losing this heat to achieve the maximum responsivity to the incident radiation. Such detectors are commonly mounted on heat sinks that provide an adequate thermal path to improve the detector speed. However, with direct current radiometers, the radiometers make use of detectors having relatively long time constants with concomitant increased responsivity. Thus, the prevention of loss of thermal energy from this type of detector is a major problem. Anything connected to the detector which conducts heat away from the detector contributes to this problem.

One approach which might be considered a solution to the problem of thermally isolating the detector from its mounting and environment would be to mount the detector on insulating material to prevent heat being transferred from the detector housing directly to the detector or vice versa. However, provision must be made for attaching electrical connections to the detector. Electrical connections are inherently good conductors of heat so that mounting the detector on insulating material does not in itself provide the complete solution to the problem.

Accordingly, it is an object of this invention to provide a mounting structure for an unbacked thermal detector and a method of making the same in which electrical connections are provided for a thermal detector which still provide effective thermal isolation of the detector from its mounting and surrounding environment.

A further object of this invention is to provide a mounting means for an unbacked thermal detector and a method of making the same which is relatively simple, easy to fabricate and yet extremely rugged.

In carrying out this invention in one illustrative embodiment thereof, a thermal detector is mounted in a central opening of a thin layer of insulating material by a plurality of fibers of insulating material. Separated portions of the layer of insulating material, and the electrical contacts of the detector as well as the fibers are coated with a thin electrical conductive coating which establishes electrical connection between a portion of the detector and the coated layer via the fibers of insulating material. External electrical connections are then taken from the coated layer of insulating material instead of being made directly to opposite portions of the detector. This structure lends itself to ready fabrication by the method of first mounting the thermal detector on a layer of insulating material by using insulated fibers, then masking out the central portion of the detector and insulated layer between a pair of fibers, and then vacuum deposition of a thin conductive coating over the exposed surfaces. When the mask is then removed, electrical connection is established from opposite sides of the detector along the coated fibers to the coated portions of the insulating material to which external electrical leads are attached.

Figure 4:
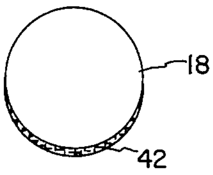
Figure 2:
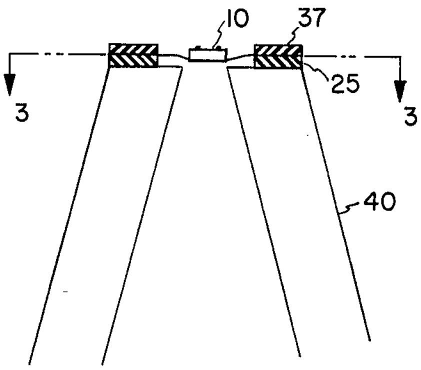
Figure 3:
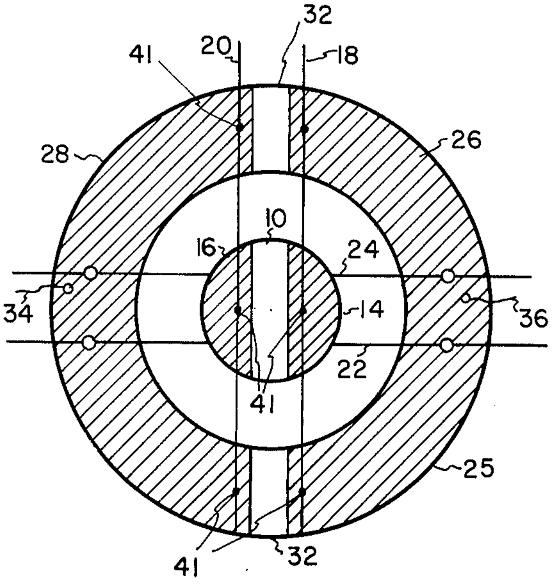

The invention, both as to organization and method of operation, together with further objects and advantages thereof, may best be understood by reference to the following description taken in connection with the accompanying drawings, in which:

FIG. 1 is an enlarged exploded view of a mounting structure which is greatly exaggerated in size for illustrative purposes, FIG. 2 is a cross-sectional view of the mounting structure shown in FIG. 1 mounted on a conical housing, FIG. 3 is a sectional view taken along lines 3—3 of FIG. 2, and FIG. 4 is an enlarged cross-sectional view of one of the gold shadowed fibers utilized in this invention.

Referring now to FIG. 1, there is shown a detector 10 which is illustrated as being a thermistor flake having a thin coating 12 of selenium or other suitable insulating material on one side thereof and two separated areas of conductive coating or detector contacts 14 and 16 on the other side thereof. A pair of partially conductive coated acrylic fibers 18 and 20, which are preferably gold-shadowed as will be explained hereinafter, are secured to the detector contacts 14 and 16, respectively. A second pair of acrylic fibers 22 and 24 are mounted directly on the other side of the detector flake 10 and the coating 12 is then applied to this same side. A thin layer of insulating material 25, such as polyethylene terephthalate sold under the trade name of Mylar, is provided having a central opening 30 therein and two separated conductive coatings 26 and 28 thereon which are separated by a space 32. The layer 25 is shown in disc form with an annular configuration, but it may be shaped in accordance with its particular application. The gold shadowed fiber 18 is attached to the conductive coating 26 and the gold shadowed fiber 20 is connected to the conductive coating 28. An electrical lead 36 is connected to the conductive coating 26 and an electrical lead 34 is connected to the conductive coating 28. Accordingly, an electrical connection is thus established to one side of the thermistor flake 10 through the contact 14, the gold shadowed fiber 18, the conductive coating 26 and the electrical lead 36. An electrical connection is also provided from the other side of the thermistor flake 10 through the contact 16, the gold shadowed fiber 20, the conductive area 28 and the electrical lead 34. The non-conductive acrylic fibers 22 and 24 are also secured to the layer of insulating material 25 by a suitable adhesive means. If desired, the fibers and electrical leads may be sandwiched together by providing another thin layer of insulating material 37 which is secured by any suitable adhesive means to the insulating layer 25 to provide a sandwich for the detector assembly.

As is shown in FIG. 2, the detector assembly of FIG. 1 may be mounted on a conical support 40 which is utilized to collect radiation and direct it onto the detector 10. FIG. 2 is merely illustrative of the many different types of mountings in which the detector assembly as shown in FIG. 1 may have application.

The mounting structure as illustrated in FIG. 1 provides an electrical connection to the detector 10 through a very thin coating on fiber of insulating material which provides a greatly reduced heat path when compared to a solid conductor which normally would be attached to a detector. The acrylic fibers at the same time provide a strong support for the detector assembly, enabling the assembly to withstand hevay vibration or shock which might be encountered.

The mounting structure which has been described lends itself to easy fabrication. The acrylic fibers are first secured to the detector on opposite sides thereof by suitable adhesives, such as an epoxy resin e.g., at points 41 as illustrated in FIG. 3. A mask is then placed over portions of the detector 10 and the insulating layer 25 between the acrylic fibers 18 and 20. The unit so masked is then ready for the vacuum deposition of a metallic coating on the detector, the acrylic fibers and the layer of insulating material. The metallic coating is chosen from the class consisting of gold, silver and platinum, and preferably is made with gold. Gold is particularly suited for this application because it is easy to evaporate, is a good reflector of infrared radiation as well as being an excellent conductor of electricity. Then a second layer of insulating material, such as Mylar, may be applied to form a sandwich for the assembly.

The above described method provides a simple way of fabricating an unbacked thermal detector. In one vacuum deposition step all of the necessary electrical conductive coatings are applied. By coating the acrylic fibers in this method rather than making electrical connnections directly through solid conductors, the heat path is greatly reduced with no appreciable reduction in electrical conductivity. Furthermore, the gold shadowing as applied by the evaporation technique covers only a portion of each fiber, increasing the diameter of the fiber by only about 10%. This is amply illustrated in FIG. 4 which shows the shadowing 42 covering only a small portion of the fiber 18. The strength of the fiber suspension is in no way affected by the evaporation of the conductive coating due to the extreme thinness of the conductive coating, which is approximately 1000 A. Accordingly, the detector assembly can withstand a substantial amount of vibration, shock or other external disturbances, making such a mounting suitable for a variety of applications.

Although acrylic fibers have been referred to in the disclosure, it will be apparent to those skilled in the art that other fibers may be utilized, depending on the environment and application to which they are subjected. For example, organic fibers, such as acrylic, inorganic fibers, such as glass, or natural fibers, such as silk, may be employed in the teachings of the present invention.

Since other modifications varied to fit particular operating requirements and environments will be apparent to those skilled in the art, the invention is not considered limited to the examples chosen for purposes of disclosure, and covers all changes and modifications which do not constitute departures from the true spirit and scope of this invention.

What we claim as new and desire to secure by letters patent of the United States is:

1. A mounting structure for an unbacked thermal detector which effectively thermally isolates the detector from the mounting while at the same time permitting electrical connection thereto comprising a first thin layer of insulating material having a central opening therein and two separated areas of conductive coating thereon, a thermal detector having two contacts thereon, at least one fiber of insulating material being secured to each contact on said thermal detector and to each area of conductive coating on said layer for mounting said detector in the central opening on said layer, said fiber having a conductive coating on at least a portion of the fiber between the contacts on said detector and the conductive areas on said layer for establishing electrical conductivity between said detector and the conductive areas on said layer.

2. The mounting structure recited in claim 1 wherein said conductive coatings and said contacts are gold.

3. The mounting structures recited in claim 1 wherein said thin layer of insulating material is annular shaped.

4. The mounting structure recited in claim 1 including a second thin layer of insulating material shaped similarly to said first thin layer of insulating material and being mounted thereon to form a sandwich mount for said fibers holding said detector therein.

5. The mounting structure recited in claim 4 in which said first and second thin layers of insulating material are annular shaped and said coatings and contacts are gold.

References Cited by the Examiner

UNITED STATES PATENTS

| | | | |
|---|---|---|---|
| 2,587,674 | 3/52 | Aiken | 250—83.3 |
| 2,986,935 | 6/61 | Cupido | 73—355 |
| 3,021,595 | 2/62 | Milam | 29—473 |
| 3,034,355 | 5/62 | Butler | 73—355 |
| 3,103,585 | 9/63 | Johnson et al. | 250—83 |
| 3,114,041 | 12/63 | Amsterdam | 250—83 |
| 3,119,172 | 1/64 | Mazenko et al. | 29—155.5 |

RALPH G. NILSON, *Primary Examiner.*